(12) United States Patent
Anderson et al.

(10) Patent No.: US 6,951,784 B1
(45) Date of Patent: Oct. 4, 2005

(54) THREE-MASK METHOD OF CONSTRUCTING THE FINAL HARD MASK USED FOR ETCHING THE SILICON FINS FOR FINFETS

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/710,822

(22) Filed: Aug. 5, 2004

(51) Int. Cl.[7] .............................................. H01L 21/00
(52) U.S. Cl. ...................................... 438/157; 438/283
(58) Field of Search ............................... 438/151, 157, 438/283

(56) References Cited

U.S. PATENT DOCUMENTS

| | | |
|---|---|---|
| 6,391,695 B1 | 5/2002 | Yu |
| 6,413,802 B1 | 7/2002 | Hu et al. |
| 6,433,609 B1 | 8/2002 | Voldman |
| 6,610,576 B2 | 8/2003 | Nowak |
| 6,611,029 B1 | 8/2003 | Ahmed et al. |
| 6,835,609 B1 * | 12/2004 | Lee et al. ................. 438/183 |
| 6,838,322 B2 * | 1/2005 | Pham et al. ............... 438/151 |
| 2003/0102497 A1 | 6/2003 | Fried et al. |
| 2003/0113970 A1 | 6/2003 | Fried et al. |

* cited by examiner

Primary Examiner—David Nelms
Assistant Examiner—Quoc Hoang
(74) Attorney, Agent, or Firm—McGinn & Gibb, PLLC; William D. Sabo, Esq.

(57) ABSTRACT

Presented is a three-mask method of constructing the final hard mask used for etching the silicon fins and the source/drain silicon regions for FinFETs, and silicon mesas for non-FinFET devices such as resistors, diodes, and capacitors. More specifically, a first mask is used to create a mandrel; a second mask is used to pattern the mandrel's sidewall spacers; and a third mask is used to pattern the box-shaped structures that are connected by one of the sidewall spacers. An alignment of the gate conductor to the box-shaped structures is provided.

20 Claims, 11 Drawing Sheets

THREE-MASK METHOD OF CONSTRUCTING THE FINAL HARD MASK USED FOR ETCHING THE SILICON FINS FOR FINFETS

BACKGROUND ART

1. Field of the Invention

This disclosure presents a method of manufacturing a fin-type field effect transistor (FinFET), which uses a three-mask method of constructing the final hard mask used for etching the silicon fins, the source/drain silicon regions, and silicon mesas for non-FinFET devices such as resistors, diodes, and capacitors.

2. Description of the Related Art

As the need to decrease the size of transistors continues, new and smaller types of transistors are created. One recent advance in transistor technology is the introduction of fin type field effect transistors that are known as FinFETs. U.S. Pat. No. 6,413,802 to Hu et al. (hereinafter "Hu"), which is incorporated herein by reference, discloses a FinFET structure that includes a center fin that has a channel along its center and source and drains at the ends of the fin structure. A gate conductor covers the channel portion.

While FinFETs structures reduce the size of transistor based devices, it is still important to continue to improve FinFETs and methods of manufacturing FinFETs. The invention described below uses a three-mask method of constructing the final hard mask used for etching the silicon fins, and the source/drain silicon regions for FinFETS, and silicon mesas for non-FinFET devices such as resistors, diodes, and capacitors.

SUMMARY OF THE INVENTION

This disclosure presents a method of manufacturing a fin-type field effect transistor (FinFET), which begins by forming a mandrel over a laminate structure. The laminate structure includes a substrate, a silicon layer above the substrate, and a hard mask above the silicon layer. Next, the invention forms sidewall spacers around the perimeter of the mandrel and then removes the mandrel, which leaves the freestanding sidewall spacers in place. The invention then utilizes some patterned masks to remove all of selected segments of the sidewall spacers.

Next, the invention uses a photo-mask to form box-shaped structures over portions of the sidewall spacers that remain, such that segments of the remaining sidewall spacers connect the box-shaped structures and create a modified H-shaped structure over the hard mask. This process of forming the box-shaped structures includes forming alignment marks in the laminate structure separate from the modified H-shaped structure.

Then, the invention transfers the modified H-shaped structure pattern into the hard mask, and, afterwards, removes the modified H-shaped structure. Following this, the invention uses the hard mask to transfer the modified H-shaped structure pattern into the silicon layer, such that a portion of the silicon layer acquires the modified H-shaped structure that includes two opposing box-shaped structures connected by a fin.

Next, the invention grows a sacrificial oxide on the modified H-shaped structure of the silicon layer and implants impurities into the fin of the silicon layer to adjust the threshold voltage in the channel regions. Then, the sacrificial oxide is removed and a gate oxide is formed/grown over the fin of the silicon layer.

Subsequently, the invention forms a gate conductor between the box-shaped structures of the silicon layer. The gate conductor intersects the fin. This process of forming the gate conductor aligns the gate conductor with the modified H-shaped structure using the alignment marks that were created by the same photo-mask that was used to create the box-shaped structures. Next, the invention forms a gate sidewall spacer on the gate conductor. The gate sidewall spacer is present only on the gate conductor and is not present on the modified H-shaped structure of the silicon layer. Then, the inventive process grows additional silicon on the modified H-shaped structure of the silicon layer. After the process of growing the additional silicon, the invention implants impurities into the modified H-shaped structure of the silicon layer to form the source/drains and extensions, as well as halos. Well-known processing techniques are then used to complete the structure to form various isolators/insulators, contacts, etc.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DISCLOSURE OF INVENTION

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

The invention presents a three-mask method of constructing the final hard mask used for etching the silicon fins and the source/drain silicon regions for FinFETs, and silicon mesas for non-FinFET devices such as resistors, diodes, and capacitors. An alignment tree and process is described below which largely preserves layout features found in conventional CMOS processes.

Figure 1A:
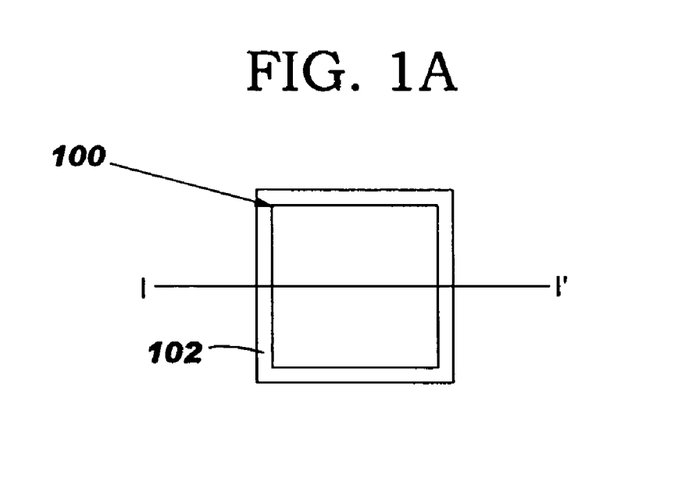
FIGS. 1A and 1B are schematic diagrams of a partially completed finFET structure.
Figure 1B:
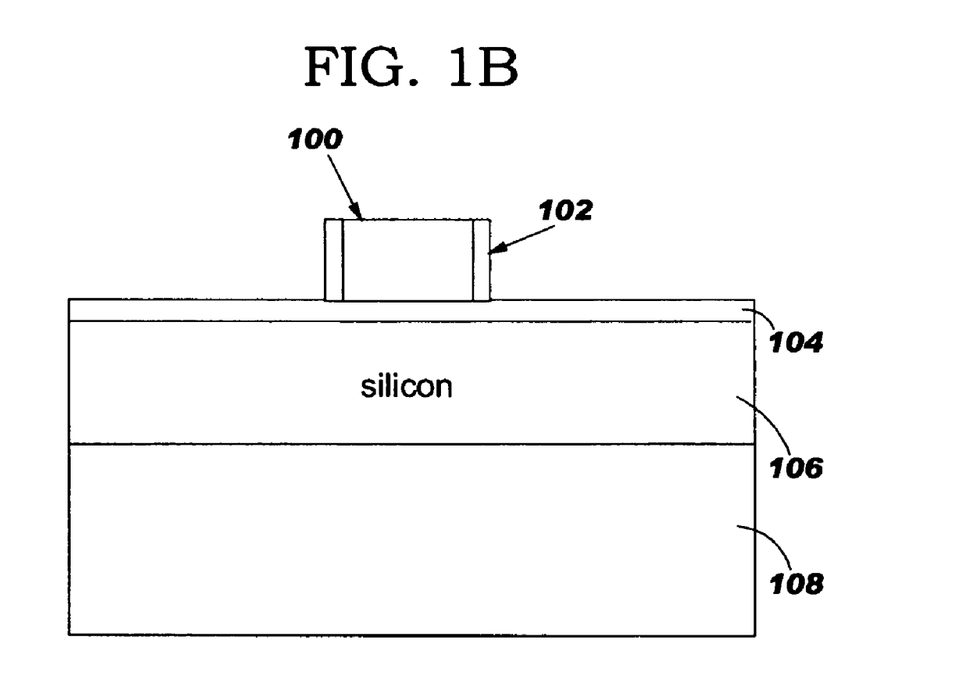

This disclosure presents a method of manufacturing a fin-type field effect transistor (FinFET), which begins by forming a mandrel 100 over a laminate structure (FIGS. 1A, 1B). The mandrel 100 can comprise any patterned material, such as a photoresist, silicon nitride, silicon dioxide, polysilicon, etc. Note that, in the drawings, and the "A" figures represent a top or plan view of the structure while the "B" figures are cross-sectional diagrams along either lines I–I' or II–II' of the structure shown in the "A" figure. The laminate structure includes a substrate 108, a silicon layer 106 above the substrate 108, and a hard mask 104 (e.g., silicon dioxide, silicon nitride, etc.) above the silicon layer 106.

Figure 2A:
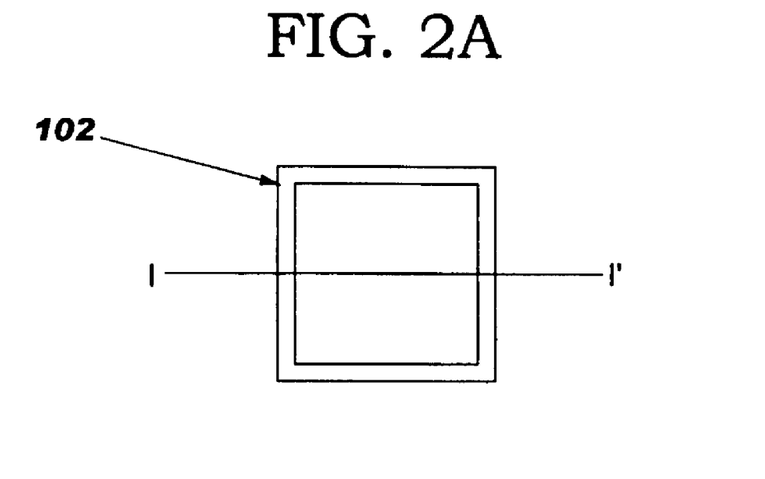
FIGS. 2A and 2B are schematic diagrams of a partially completed finFET structure.
Figure 2B:
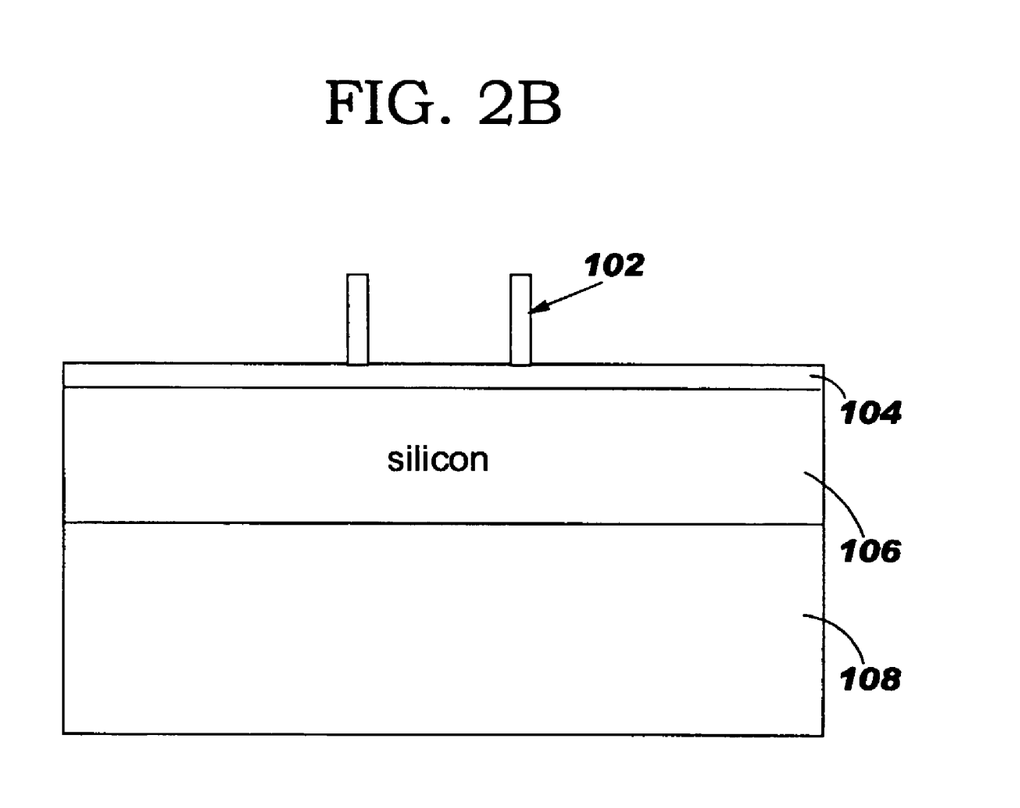
Figure 3A:
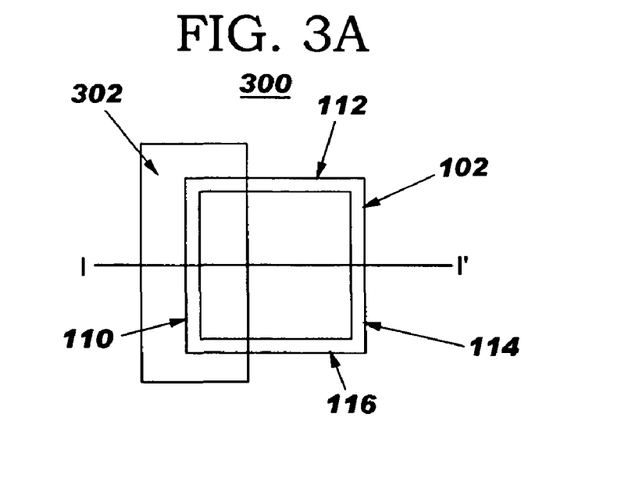
FIGS. 3A and 3B are schematic diagrams of a partially completed finFET structure.
Figure 3B:
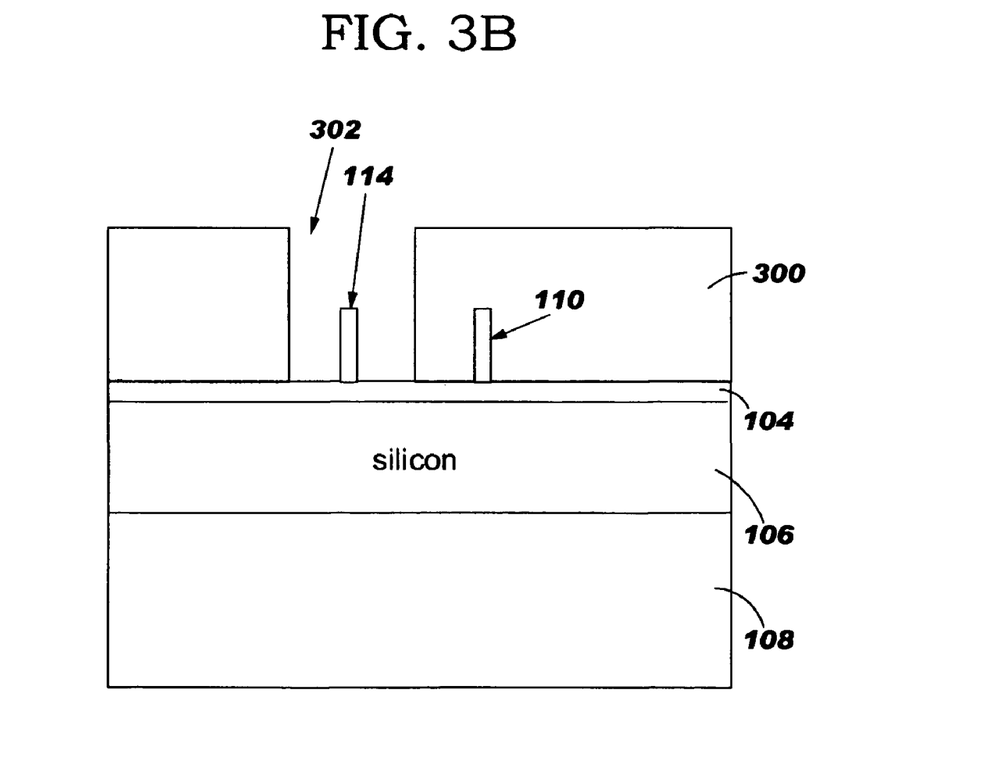
Figure 4A:
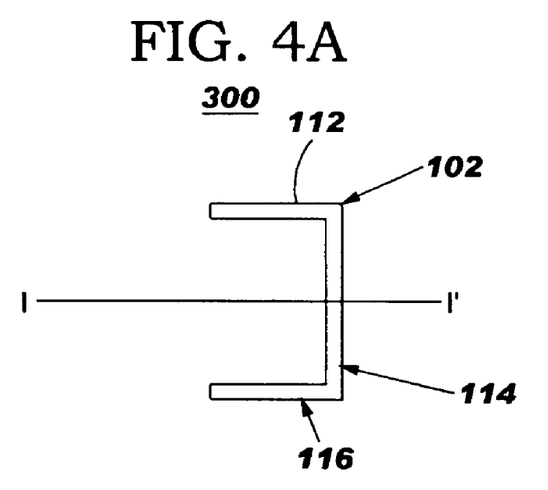
FIGS. 4A and 4B are schematic diagrams of a partially completed finFET structure.
Figure 4B:
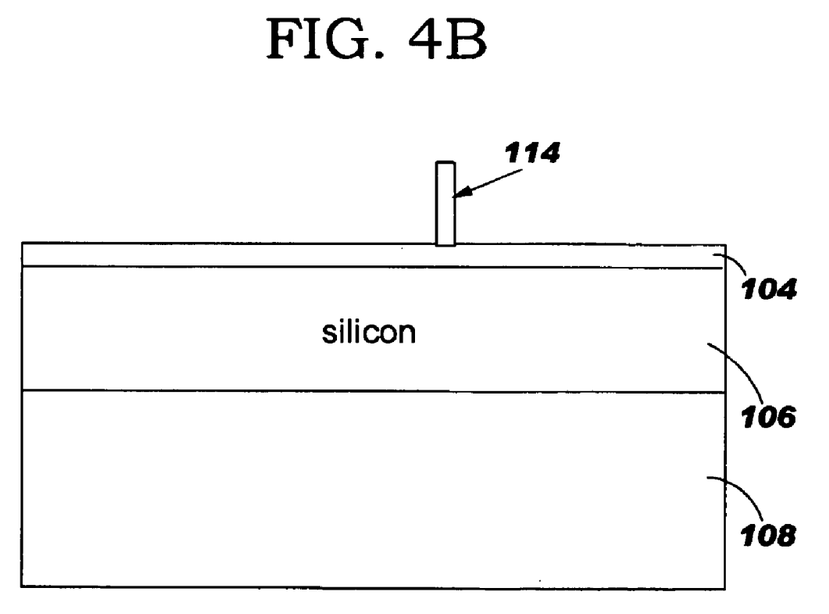

Next, the invention forms sidewall spacers 102 around the sides of the mandrel 100 and then removes the mandrel, which leaves the freestanding sidewall spacers 102 in place (FIGS. 2A, 2B). The sidewall spacers can comprise any formed spacer material, such as silicon dioxide, silicon nitride, polysilicon, etc. As shown in FIG. 3, the invention then utilizes patterned masks 300 to remove all of selected segments of sidewall spacers 110, 112, 116. Item 300 represents the mask and item 302 represents an opening in the mask through which an etching process reaches to remove the spacer 110. The mask 300 can comprise any patterned material such as a photoresist, silicon nitride, silicon dioxide, etc. This forms a U-shaped or C-shaped freestanding structure (when viewed from the top) on the hard mask 104, as shown in FIGS. 4A, 4B (which illustrates the structure after the mask 300 is removed).

Figure 5A:
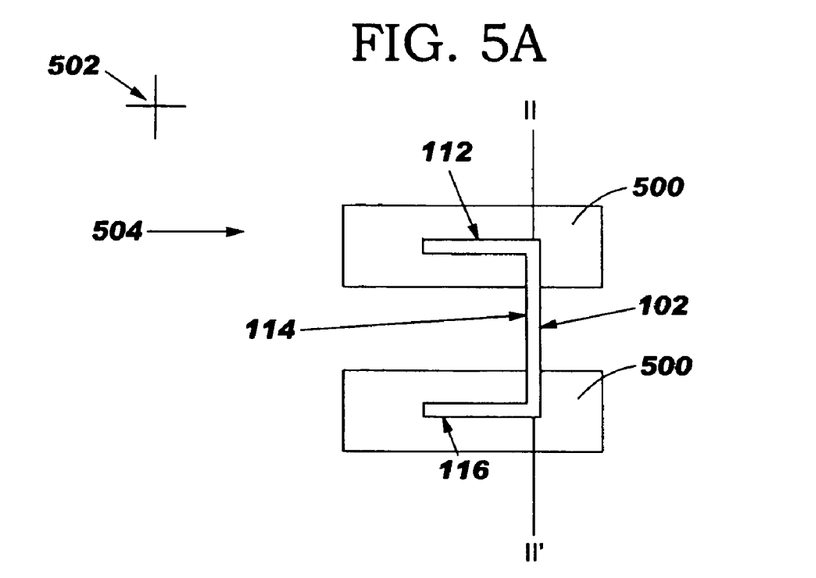
FIGS. 5A and 5B are schematic diagrams of a partially completed finFET structure.
Figure 5B:
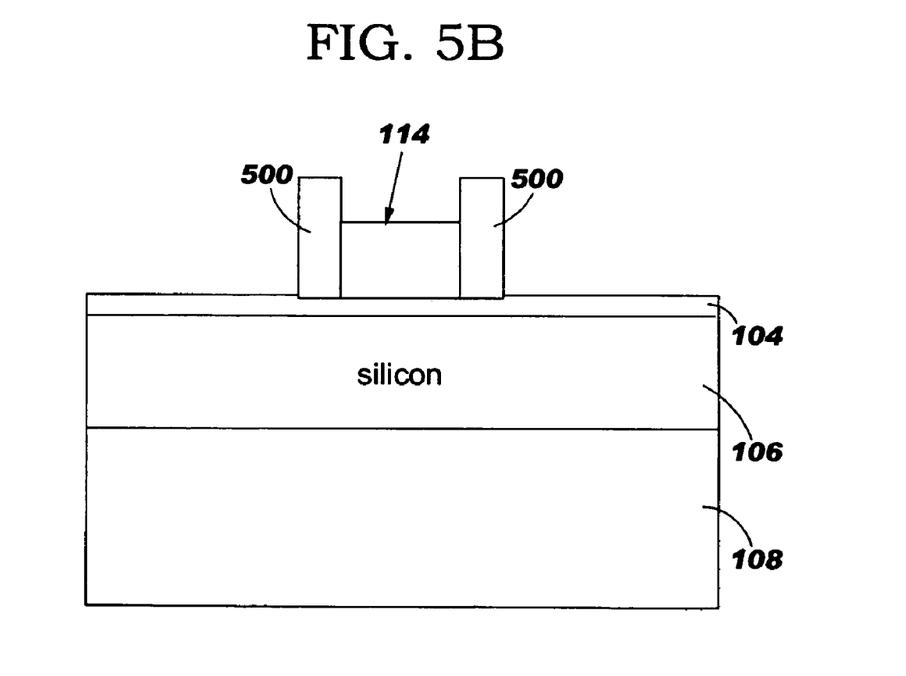

Next, as shown in FIGS. 5A and 5B, the invention forms box-shaped structures 500 over the opposing sidewall spacers 112, 116 that remain after removing the first sidewall spacer 110, such that the odd remaining sidewall spacer 114 connects the box-shaped structures 500 and creates a modified H-shaped structure 504 over the hard mask 104. The mask 500 can comprise any patterned material such as a photoresist, silicon nitride, silicon dioxide, etc. The structure is referred to as a "modified" H-shaped structure 504 because the odd fin 114 is not centered along the lengths of the opposing box-shaped structures 500. This process of forming the box-shaped structures 500 includes forming alignment marks 502 in the laminate structure separate from the modified H-shaped structure 504. The alignment marks 502, are shapes defined by the mask used to define the box-shaped structures 500. These marks 502 are transferred into the hardmask material 104 and subsequently used to pattern a region of silicon 106. These marks 502 are used in subsequent steps to align the photo-expose tool for patterning the gate conductor, thus assuring that optimum overlay (minimum overlay error) of the gate to the box-shaped structures is achieved. The marks 502 are not shown in the "B" figures because they are very distant from the H-shaped structures 500.

Figure 6A:
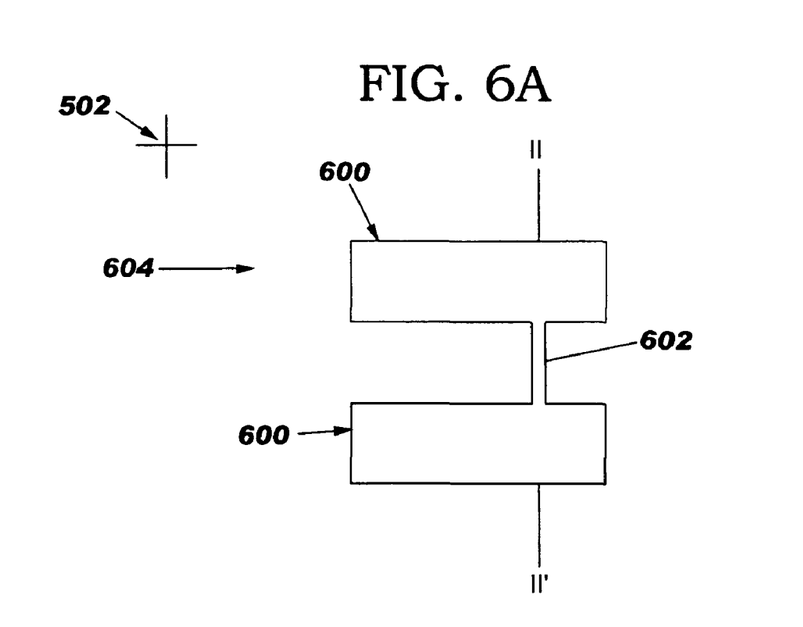
FIGS. 6A and 6B are schematic diagrams of a partially completed finFET structure.
Figure 6B:
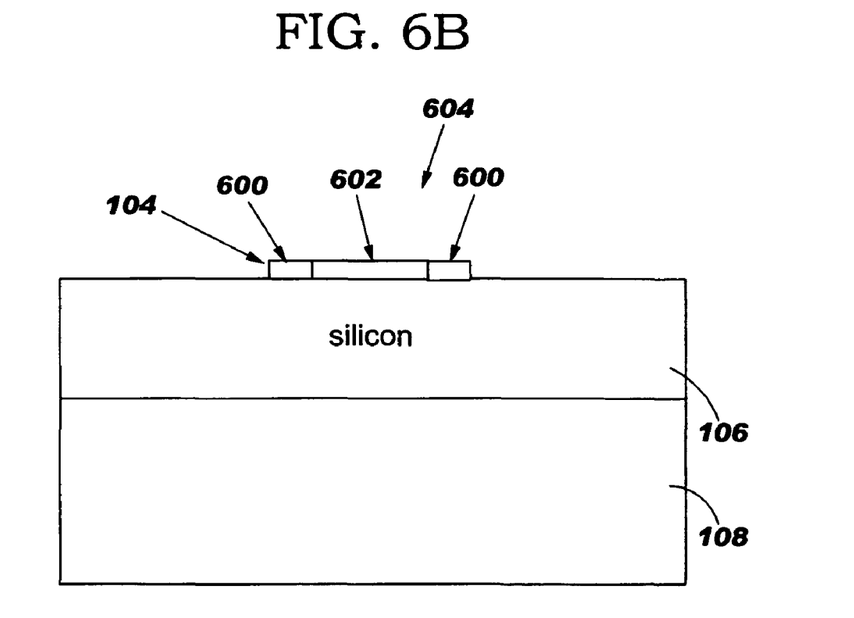

Then, as shown in FIGS. 6A and 6B the invention transfers the modified H-shaped structure pattern 504 into the hard mask 104 (through an etching or similar well-known material removal process). The modified H-shaped structure in the hard mask 104 is identified in the drawings as item 604. This modified H-shaped structure 604 also includes opposing box-shaped structures 600 and a connecting fin 602. Afterwards, the invention removes the modified H-shaped structure 504.

Thus, as shown above, the invention presents a three-mask method of constructing the final hard mask 604 used for etching the silicon fins, and the source/drain silicon regions for FinFETS, and silicon mesas for non-FinFET devices such as resistors, diodes, and capacitors. More specifically, a first mask is used to create the mandrel 100; a second mask 300 is used to pattern the sidewall spacers 102; and a third mask 500 is used to pattern the box-shaped structures 600. The advantages derived from this method comprise accurate definition of very narrow fins, and minimum spacing of the gate conductor to the box-shaped structures, which result in the ability to fabricate very short gate-length FinFETs with low extrinsic resistance and high speed.

Figure 7A:
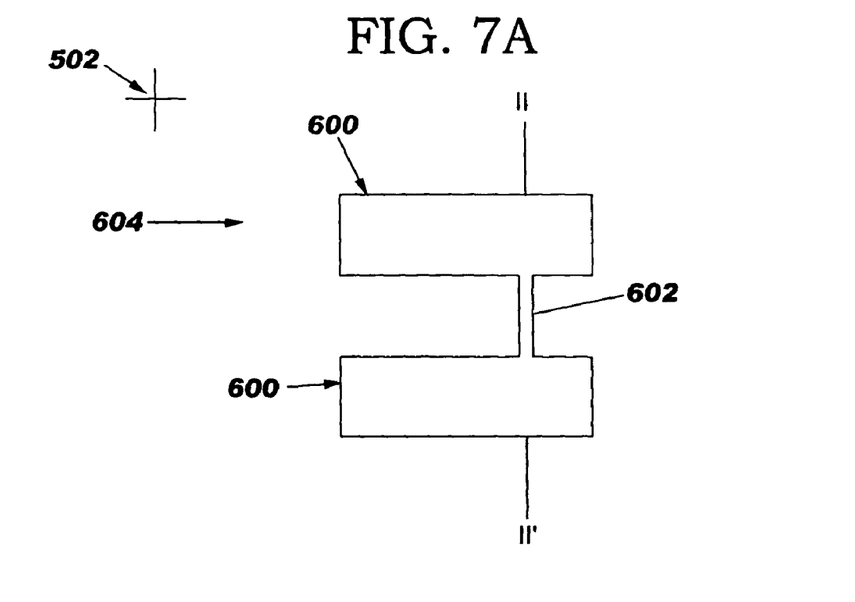
FIGS. 7A and 7B are schematic diagrams of a partially completed finFET structure.
Figure 7B:
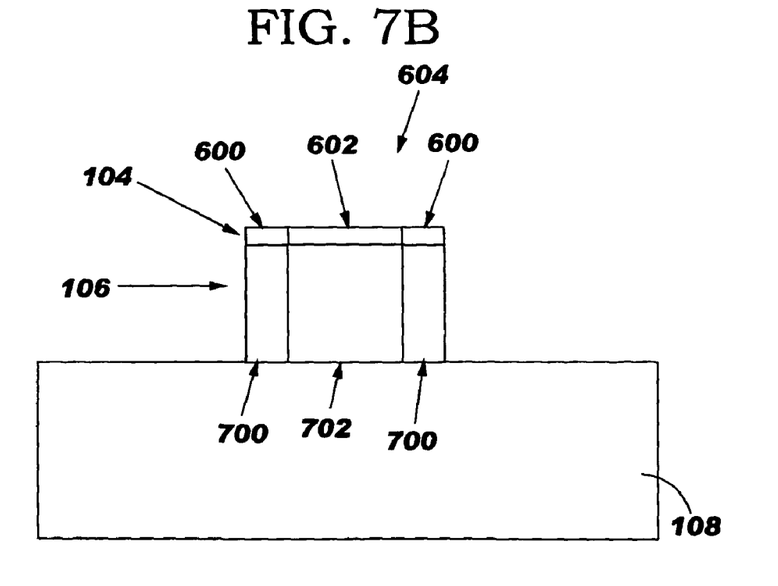

Following this, the invention uses the patterned hard mask 104 (again using an etching or similar selective material removal process) to transfer the modified H-shaped structure pattern 604 into the silicon layer 106, such that a portion of the silicon layer 106 acquires the modified H-shaped structure pattern 604, as shown in FIGS. 7A and 7B. The modified H-shaped structure in the silicon layer 106 similarly includes two opposing box-shaped structures 700 connected by a fin 702, as shown in FIG. 7B. Next, the invention grows a sacrificial oxide (not shown) on the modified H-shaped structure of the silicon layer 106 and implants impurities (such as boron, arsenic, phosphorus, indium, etc.) into the fin 702 and the box-shaped structures 700 of the silicon layer 106 to adjust the threshold voltage of the channel region. Masks (not shown) can be used to ion-implant p-type and n-type FETs separately, with differing impurities, and to create a variety of values of threshold voltages. Then, the sacrificial oxide is removed and a gate oxide is formed/grown over the fin 702 of the silicon layer 106.

Figure 8A:
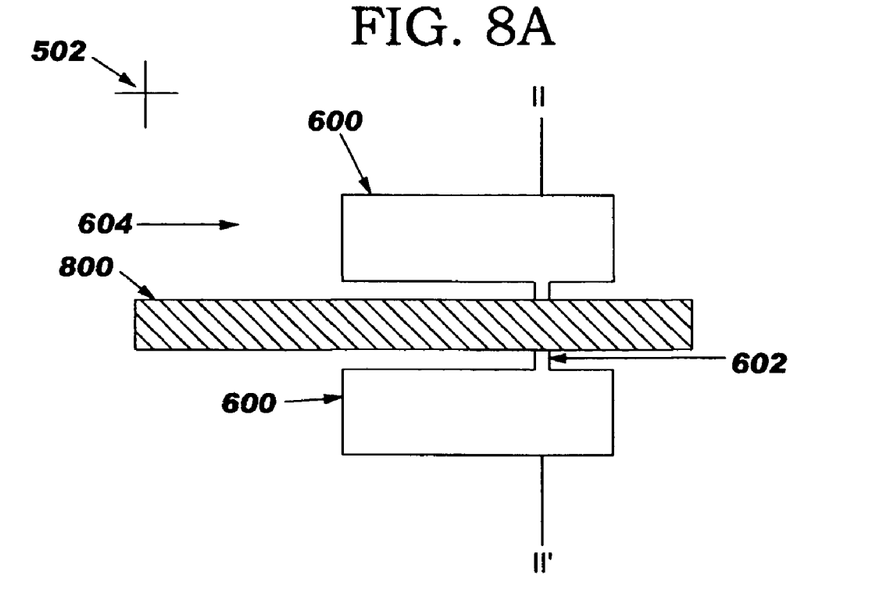
FIGS. 8A and 8B are schematic diagrams of a partially completed finFET structure.
Figure 8B:
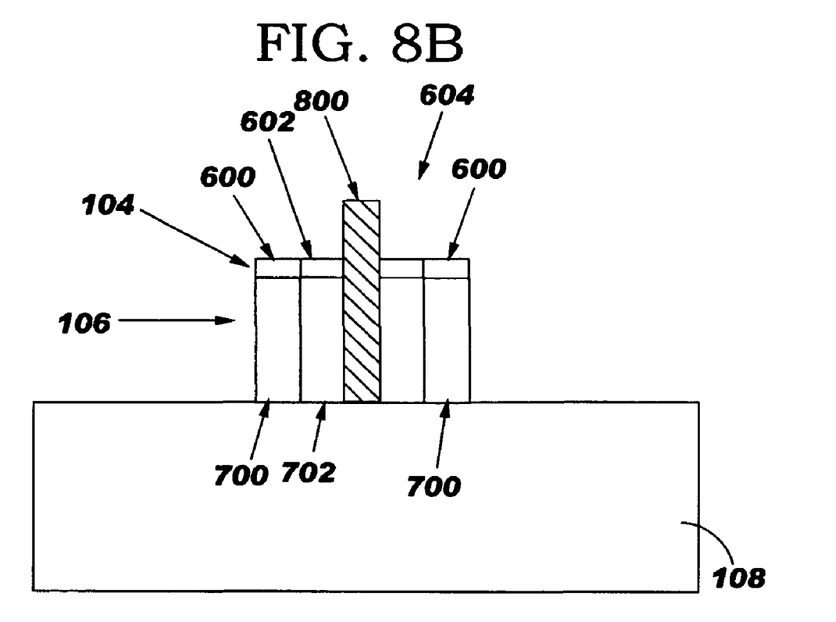

Subsequently, the invention forms a gate conductor 800 between the box-shaped structures of the silicon layer 106, as shown in FIGS. 8A and 8B. The gate conductor 800 can comprise, for example, polysilicon, metal, metal alloy, etc. that is patterned using a conventional masking process (not illustrated). The gate conductor 800 intersects the fin 702 and is separated from the fin 702 by a gate oxide or other gate insulator, such as the so-called high-k materials (e.g. hafnium silicate, or hafnium dioxide). This process of forming the gate conductor 800 aligns the gate conductor 800 with the modified H-shaped structure using the alignment marks 502 that were created by the same photo-mask used to create the box-shaped structures. By utilizing the same alignment marks 502 to pattern the box-shaped structures 600, 700 and the gate conductor 800, the invention substantially increases the alignment and spacing accuracy between the gate conductor 800 and the box-shaped structures 700. Alignment to the active silicon channels, namely, the fins, as would ordinarily be preferred in planar FETs is here replaced with alignment to the shapes that define source and drain regions (box-shaped structures 600, 700). In the planar case, the critical overlay to the channel dictates alignment to the channel, while in the inventive FinFET case, additional overlay space to the channel is afforded by the narrow nature of the fins, and furthermore, alignment of the gate conductor to the box-shaped structures results in decreased extrinsic resistance and higher-speed FETs, unlike the planar FET case.

Figure 9A:
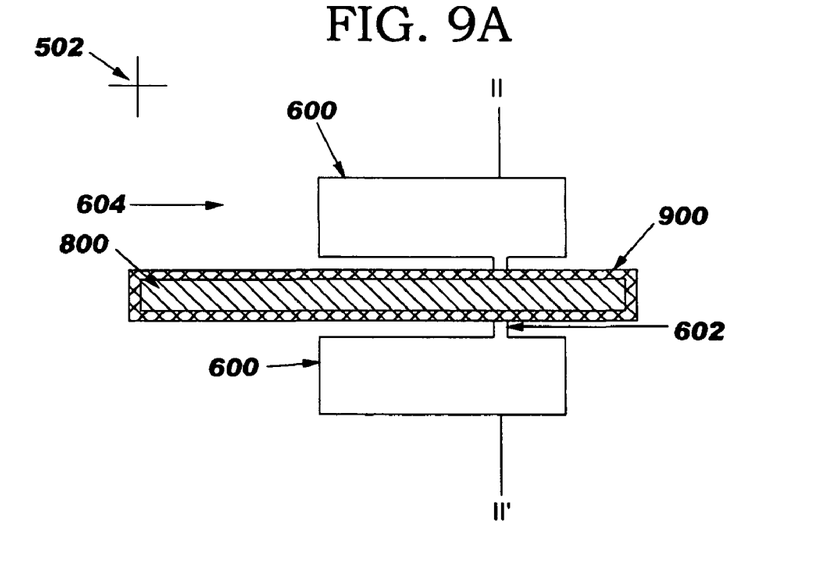
FIGS. 9A and 9B are schematic diagrams of a partially completed finFET structure.
Figure 9B:
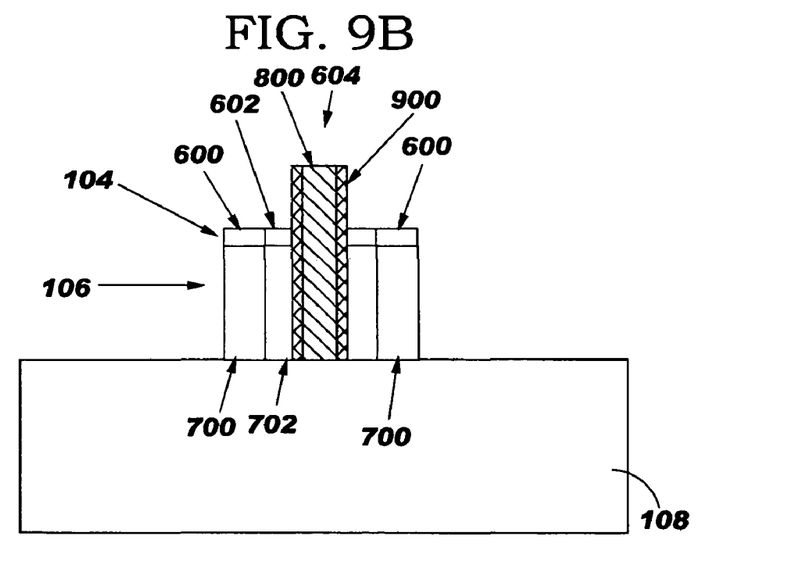

Next, as shown in FIGS. 9A and 9B, the invention forms a gate sidewall spacer 900 on the gate conductor 800. The gate sidewall spacer 900 can comprise any grown or formed material including, silicon dioxide, silicon nitride, etc. The gate sidewall spacer 900 is present only on the gate conductor 800 and is not present on the modified H-shaped structure of the silicon layer 106. The gate sidewall spacer 900 can be formed by a conformal deposition of material, such as chemical-vapor-deposition (CVD) of silicon nitride, followed by a directional etch (e.g. Reactive-Ion Etch). The directional etch only etches vertical surfaces, and as such, can be continued until all of the spacer material has been removed from the sidewalls of the fins. The gate conductor is of greater height than the fins, and hence the spacer 900 will still be remaining on the lower portions of the gate conductor 800.

Figure 10A:
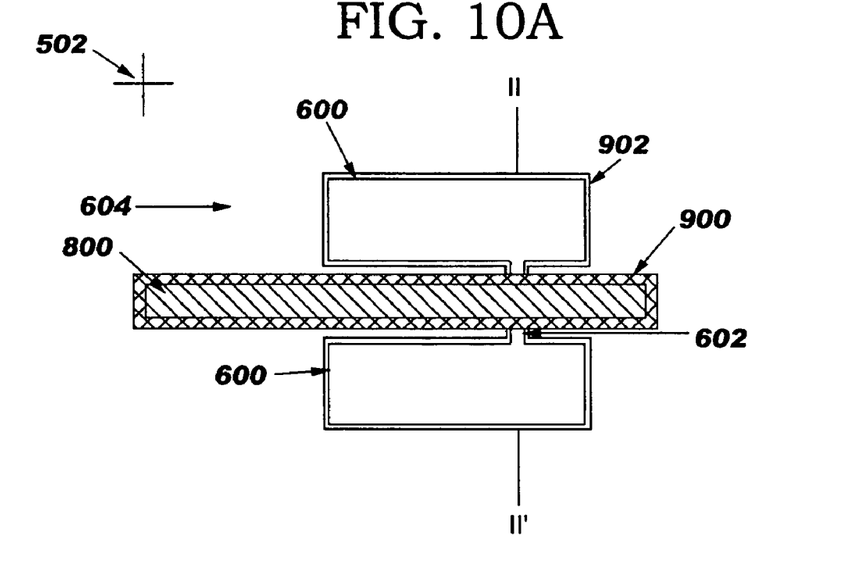
FIGS. 10A and 10B are schematic diagrams of a partially completed finFET structure.
Figure 10B:
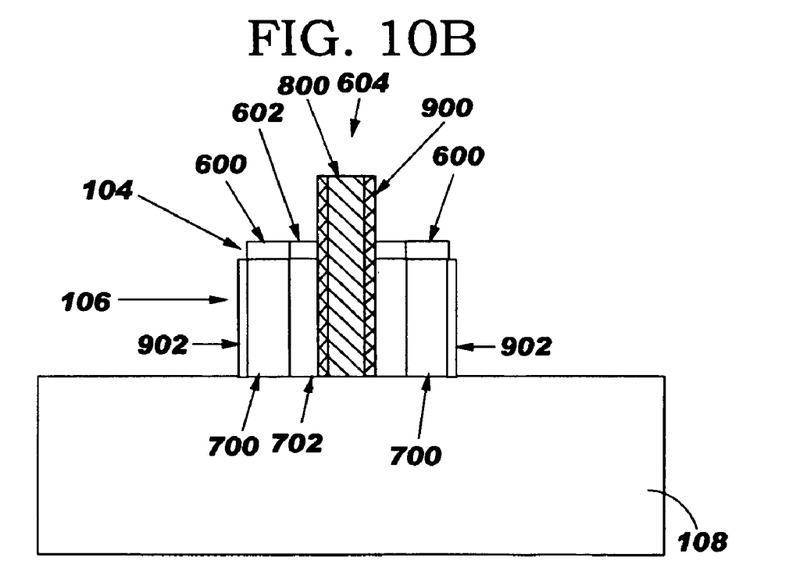

Then, as shown in FIGS. 10A and 10B, the inventive process grows additional silicon 902 on the modified H-shaped structure of the silicon layer 106. Growth of this selective silicon expands the thickness of the fins where exposed beyond the gate conductor and spacer, thereby allowing a lower extrinsic resistance of the source and drain After the process of growing the additional silicon 902, the invention implants impurities into the modified H-shaped structure of the silicon layer 106 to form the source/drains and extensions. Halos may also be implanted at this point to further reduce short-channel effects in the FinFET. Well-known processing techniques are then used to complete the structure to form various isolators/insulators, contacts, etc.

Figure 11:
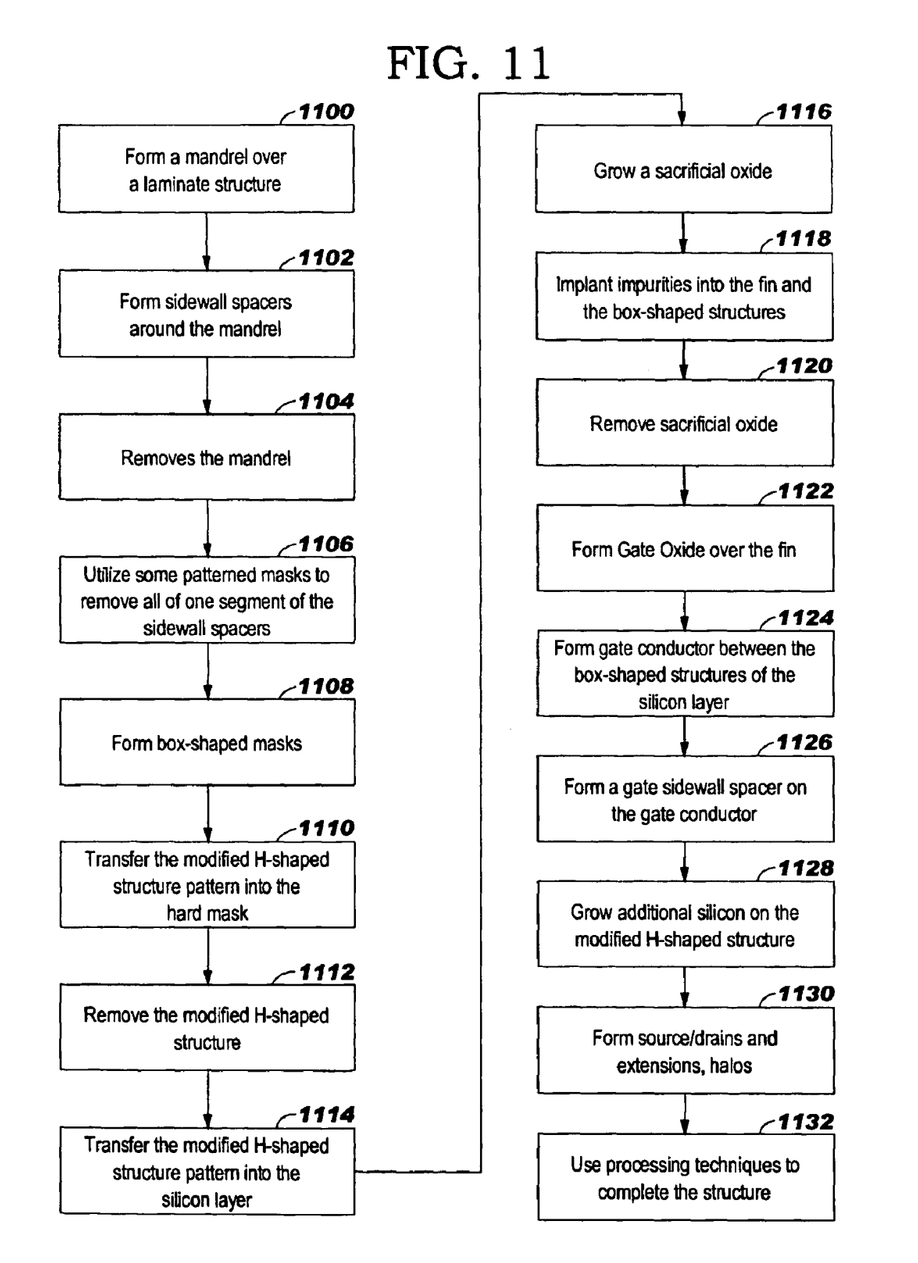
FIG. 11 is a flow diagram illustrating a preferred method of the invention.

FIG. 11 shows the invention in flowchart form. More specifically, the inventive process begins by forming a mandrel over a laminate structure 1100. The laminate structure includes a substrate, a silicon layer above the substrate, and a hard mask above the silicon layer. Next, the invention forms sidewall spacers around the mandrel 1102 and then removes the mandrel 1104, which leaves the freestanding sidewall spacers in place. The invention then utilizes some patterned masks to remove segments of the sidewall spacers 1106. This forms a sideways U-shaped or backwards C-shaped freestanding structure (when viewed from the top) on the hard mask. Next, the invention forms box-shaped structures 1108 over the opposing sidewall spacers that remain after removing the first sidewall spacer, such that the sidewall spacer connects the box-shaped structures and creates a modified H-shaped structure over the hard mask. This process of forming the box-shaped structures 1108 includes forming alignment marks in the laminate structure separate from the modified H-shaped structure, using the photo-mask that is also used to define the box-shaped structures.

Then, the invention transfers the modified H-shaped structure pattern into the hard mask 1110, and, afterwards, removes the modified H-shaped structure 1112. Following this, the invention uses the hard mask to transfer the modified H-shaped structure pattern into the silicon layer 1114, such that a portion of the silicon layer acquires the modified H-shaped structure that includes two opposing box-shaped structures connected by a fin.

Next, the invention grows a sacrificial oxide 1116 on the modified H-shaped structure of the silicon layer and implants impurities into the fin and the box-shaped structures 1118 of the silicon layer to form the channel region and source/drain regions. Then the sacrificial oxide is removed 1120 and a gate oxide is formed/grown over the fin of the silicon layer 1122.

Subsequently, the invention forms a gate conductor between the box-shaped structures of the silicon layer 1124. The gate conductor intersects the fin. This process of forming the gate conductor 1124 aligns the gate conductor with the modified H-shaped structure using the alignment marks that were formed with the same photo-mask that was used to create the box-shaped structures. Next, the invention forms a gate sidewall spacer on the gate conductor 1126. The gate sidewall spacer is present only on the gate conductor and is not present on the modified H-shaped structure of the silicon layer. Then, the inventive process grows additional silicon on the modified H-shaped structure of the silicon layer 1128. After the process of growing the additional silicon, the invention implants impurities into the modified H-shaped structure of the silicon layer to form the source/drains and extensions and halos 1130. Well-known processing techniques are then used to complete the structure 1132 to form various isolators/insulators, contacts, etc.

Thus, as shown above, the invention presents a three-mask method of constructing the final hard mask 604 used for etching the silicon fins, and the source/drain silicon regions for FinFETs, and silicon mesas for non-FinFET devices such as resistors, diodes, and capacitors. More specifically, a first mask is used to create the mandrel 100; a second mask 300 is used to pattern the sidewall spacers 102; and a third mask 500 is used to pattern the box-shaped structures 600. The advantages derived from this method comprise accurate definition of very narrow fins, and minimum spacing of the gate conductor to the box-shaped structures, which result in the ability to fabricate very short gate-length FinFETs with low extrinsic resistance and high speed.

This invention provides advantages which include low-extrinsic resistance FinFETs with low gate-to-drain capacitance. Furthermore the FinFETs provided by this invention are able to switch at very high speeds as a result of these advantages. Increased circuit density and decreased power consumption follow from the combination of elements herein provided, as well. Thus high-speed, and/or low-power CMOS circuits and products, such as microprocessors, memory, digital signal processors, and analog applications can derive benefits of increased power efficiency, lower cost, and higher speed.

While the invention has been described in terms of preferred embodiments, those skilled in the art will recognize that the invention can be practiced with modification within the spirit and scope of the appended claims.

What is claimed is:

1. A method of manufacturing a fin-type field effect transistor (FinFET), said method comprising:

forming a modified H-shaped structure over a silicon layer structure, wherein said forming of said modified H-shaped structure includes forming alignment marks in said silicon layer structure separate from said modified H-shaped structure;

transferring said modified H-shaped structure pattern into a silicon layer of said silicon layer structure, such that a portion of said silicon layer has said modified H-shaped structure that includes two opposing box-shaped structures connected by a fin;

forming a gate conductor between said box-shaped structures of said silicon layer, wherein said gate conductor intersects said fin, and wherein said process of forming said gate conductor aligns said gate conductor with said modified H-shaped structure using said alignment marks;

forming a gate sidewall spacer on said gate conductor, wherein said gate sidewall spacer is present only on said gate conductor and is not present on said modified H-shaped structure of said silicon layer; and growing additional silicon on said modified H-shaped structure of said silicon layer.

2. The method in claim 1, wherein said process of forming said modified H-shaped structure comprises:

forming mandrels on said silicon layer structure;

forming sidewall spacers around said mandrels;

removing said mandrels and leaving said sidewall spacers in place;

removing portions said sidewall spacers; and forming masks over portions of said sidewall spacers, such that a remaining sidewall spacer connects said masks and creates said modified H-shaped structure.

3. The method in claim 2, wherein said remaining spacer is perpendicular to said opposing sidewall spacers.

4. The method in claim 1, further comprising, after said process of growing said additional silicon, implanting impurities into said modified H-shaped structure of said silicon layer.

5. The method in claim 1, further comprising, before forming said gate conductor:

growing a sacrificial oxide on said modified H-shaped structure of said silicon layer;

implanting impurities into said fin and said box-shaped structures of said silicon layer; and removing said sacrificial oxide.

6. The method in claim 1, further comprising, before forming said gate conductor, forming a gate insulator over said fin of said silicon layer.

7. The method in claim 1, wherein, in said modified H-shaped structure, said fin is not centered along the lengths of said opposing box-shaped structures.

8. A method of manufacturing a fin-type field effect transistor (FinFET), said method comprising:

forming a modified H-shaped structure over a laminate structure, wherein said laminate structure comprises a substrate, a silicon layer above said substrate, and a hard mask above said silicon layer, and wherein said process of forming said modified H-shaped structure includes forming alignment marks in said laminate structure separate from said modified H-shaped structure;

transferring said modified H-shaped structure pattern into said hard mask;

removing said modified H-shaped structure;

using said hard mask to transfer said modified H-shaped structure pattern into said silicon layer, such that a portion of said silicon layer has said modified H-shaped structure that includes two opposing box-shaped structures connected by a fin;

forming a gate conductor between said box-shaped structures of said silicon layer, wherein said gate conductor intersects said fin, and wherein said process of forming said gate conductor aligns said gate conductor with said modified H-shaped structure using said alignment marks;

forming a gate sidewall spacer on said gate conductor, wherein said gate sidewall spacer is present only on said gate conductor and is not present on said modified H-shaped structure of said silicon layer; and growing additional silicon on said modified H-shaped structure of said silicon layer.

9. The method in claim 8, wherein said process of forming said modified H-shaped structure comprises:

forming a mandrel on said hard mask;

forming sidewall spacers around said mandrel;

removing said mandrel and leaving said sidewall spacers in place;

removing one segment of said sidewall spacers; and forming box-shaped structures over opposing sidewall spacers that remain after removing said one segment of said sidewall spacers, such that a remaining sidewall spacer connects said box-shaped structures and creates said modified H-shaped structure.

10. The method in claim 9, wherein said remaining spacer is perpendicular to said opposing sidewall spacers.

11. The method in claim 8, further comprising, after said process of growing said additional silicon, implanting impurities into said modified H-shaped structure of said silicon layer.

12. The method in claim 8, further comprising, before forming said gate conductor:

growing a sacrificial oxide on said modified H-shaped structure of said silicon layer;

implanting impurities into said fin and said box-shaped structures of said silicon layer; and removing said sacrificial oxide.

13. The method in claim 8, further comprising, before forming said gate conductor, forming a gate oxide over said fin of said silicon layer.

14. The method in claim 8, wherein, in said modified H-shaped structure, said fin is not centered along the lengths of said opposing box-shaped structures.

15. A method of manufacturing a fin-type field effect transistor (FinFET), said method comprising:

forming a mandrel over a laminate structure, wherein said laminate structure comprises a substrate, a silicon layer above said substrate, and a hard mask above said silicon layer;

forming sidewall spacers around said mandrel;

removing said mandrel and leaving said sidewall spacers in place;

removing one segment of said sidewall spacers;

forming box-shaped structures over opposing sidewall spacers that remain after removing said one segment of said sidewall spacers, such that a remaining sidewall spacer connects said box-shaped structures and creates a modified H-shaped structure over said hard mask, and wherein said process of forming said box-shaped structures includes forming alignment marks in said laminate structure separate from said modified H-shaped structure;

transferring said modified H-shaped structure pattern into said hard mask;

removing said modified H-shaped structure;

using said hard mask to transfer said modified H-shaped structure pattern into said silicon layer, such that a portion of said silicon layer has said modified H-shaped structure that includes two opposing box-shaped structures connected by a fin;

forming a gate conductor between said box-shaped structures of said silicon layer, wherein said gate conductor intersects said fin, and wherein said process of forming said gate conductor aligns said gate conductor with said modified H-shaped structure using said alignment marks;

forming a gate sidewall spacer on said gate conductor, wherein said gate sidewall spacer is present only on said gate conductor and is not present on said modified H-shaped structure of said silicon layer; and growing additional silicon on said modified H-shaped structure of said silicon layer.

16. The method in claim 15, further comprising, after said process of growing said additional silicon, implanting impurities into said modified H-shaped structure of said silicon layer.

17. The method in claim 15, further comprising, before forming said gate conductor:

growing a sacrificial oxide on said modified H-shaped structure of said silicon layer;

implanting impurities into said fin and said box-shaped structures of said silicon layer; and removing said sacrificial oxide.

18. The method in claim 15, further comprising, before forming said gate conductor, forming a gate oxide over said fin of said silicon layer.

19. The method and in claim 15, wherein said remaining spacer is perpendicular to said opposing sidewall spacers.

20. The method in claim 15, wherein, in said modified H-shaped structure, said fin is not centered along the lengths of said opposing box-shaped structures.

* * * * *